(12) United States Patent
Negishi et al.

(10) Patent No.: US 7,376,856 B2
(45) Date of Patent: May 20, 2008

(54) CIRCUIT ARRANGEMENT

(75) Inventors: Nobuji Negishi, Sakai-machi (JP);
Masaya Kishida, Shinagawa-ku (JP)

(73) Assignee: NXP B.V., Eindhoven (NL)

( * ) Notice: Subject to any disclaimer, the term of this patent is extended or adjusted under 35 U.S.C. 154(b) by 90 days.

(21) Appl. No.: 10/540,596

(22) PCT Filed: Dec. 22, 2003

(86) PCT No.: PCT/IB03/06215

§ 371 (c)(1),
(2), (4) Date: Jun. 23, 2005

(87) PCT Pub. No.: WO2004/059839

PCT Pub. Date: Jul. 15, 2004

(65) Prior Publication Data

US 2006/0017489 A1    Jan. 26, 2006

(30) Foreign Application Priority Data

Dec. 27, 2002 (JP) .............................. 2002-382481

(51) Int. Cl.
*G06F 3/00* (2006.01)
(52) U.S. Cl. ...................... 713/401; 713/400; 713/500; 713/501; 713/502; 713/503; 713/600; 713/601
(58) Field of Classification Search ........ 713/400–401, 713/500–503, 600–601
See application file for complete search history.

(56) References Cited

U.S. PATENT DOCUMENTS

| | | | | |
|---|---|---|---|---|
| 5,670,904 A | * | 9/1997 | Moloney et al. ............ | 327/277 |
| 5,742,224 A | * | 4/1998 | Gadducci et al. ........ | 340/146.2 |
| 5,883,529 A | | 3/1999 | Kumata et al. | |
| 6,198,415 B1 | * | 3/2001 | Yoshikawa et al. ......... | 341/100 |
| 6,629,250 B2 | * | 9/2003 | Kopser et al. .............. | 713/401 |
| 6,630,853 B1 | * | 10/2003 | Hamada ..................... | 327/202 |
| 6,710,637 B1 | * | 3/2004 | Chan .......................... | 327/259 |
| 6,847,239 B2 | * | 1/2005 | Leifso et al. ............... | 327/117 |

FOREIGN PATENT DOCUMENTS

| | | |
|---|---|---|
| EP | 0524712 A2 | 1/1993 |
| EP | 0703663 A1 | 3/1996 |
| EP | 0703663 B1 | 3/1996 |

* cited by examiner

*Primary Examiner*—A. Elamin

(57) ABSTRACT

An object of the present invention is to provide a circuit device in which the power consumption can be reduced without the dedicated signal. A circuit device (1) comprising a D flip-flop (F0) for receiving a pulse of a clock signal (CK) to introduce data thereinto and output said introduced data and a shift register (2), comprising the D flip-flops (F1 to F7) for introducing the data thereinto in accordance with the pulse to output the introduced data, for processing the outputted data from the D flip-flop (F0), wherein the circuit device (1) comprises a control circuit (3) for controlling whether the D flip-flops (F1 to F7) are supplied with the pulse of the clock signal (CK) on the basis of outputted data from the D flip-flop (F0) in accordance with the pulse of the clock signal (CK) and data to be introduced into the D flip-flop (F0) in accordance with the next pulse.

6 Claims, 8 Drawing Sheets

CIRCUIT ARRANGEMENT

BACKGROUND OF THE INVENTION

1. Field of the Invention

The invention relates to a circuit device comprising a first delay circuit for outputting data in response to a pulse of a clock signal and a signal processing circuit for processing said outputted data from said first delay circuit, a signal processing circuit comprising a second delay circuit for output ting data in response to said pulse of said clock signal.

2. Description of Related Art

A circuit device comprising a plurality of D flip-flops which are cascaded, and a circuit device comprising logic circuits and D flip-flops which are alternately cascaded are known in the prior art. In such circuit devices, each of a plurality of D flip-flops receives a clock signal, introduces data thereinto in response to a pulse of the clock signal, and outputs the introduced data.

A clock frequency has been increasing with the faster processing rate of a circuit in recent years, so that a power consumption of the circuit device is increasing. Further, all D flip-flops of the circuit device are supplied with the clock signal, so that if the number of the D flip-flops increases, the power consumption increases accordingly. For the purpose of decreasing the power consumption of the circuit device, it is considered to construct a control circuit which can control whether the supply of the clock signal to the D flip-flops is allowed or blocked. However, if such a control circuit is constructed in a simple manner, there is a problem that not only a data signal to be processed in the circuit device but also a dedicated signal for only driving the control circuit mentioned above are required.

It is an object of the invention to provide a circuit device in which the power consumption can be reduced without the dedicated signal.

SUMMARY OF THE INVENTION

A circuit device according to the present invention for achieving the object comprises a first delay circuit for output ting data in response to a pulse of a clock signal and a signal processing circuit for processing said outputted data from said first delay circuit, a signal processing circuit comprising a second delay circuit for outputting data in response to said pulse of said clock signal, wherein said circuit device comprises a control circuit for controlling whether said second delay circuit should be supplied with said pulse of said clock signal on the basis of whether outputted data from said first delay circuit in response to said pulse of said clock signal is equal to data to be outputted from said first delay circuit in response to the next pulse.

The circuit device according to the present invention is provided with the control circuit for deciding whether said second delay circuit should be supplied with said pulse of said clock signal. By providing with such control circuit, it is possible to block the supply of pulse with the identity of a resultant from the signal processing circuit kept, so that the power consumption of the circuit device is reduced.

In the control circuit, the control of whether the second delay circuit should be supplied with said pulse of said clock signal is performed on the basis of whether outputted data from said first delay circuit is equal to the next data to be outputted from said first delay circuit. Therefore, the dedicated signal for only controlling whether the second delay circuit should be supplied with the pulse of the clock signal is not required, so that the circuit device can be simplified.

Further, in the circuit device according to the present invention, said signal processing circuit may comprise a plurality of said second delay circuits, and wherein at least two second delay circuits of said plurality of second delay circuits are cascaded. In this case, each of said at least two second delay circuits may comprise a plurality of data inputting portions for receiving data and a plurality of data outputting portions for outputting data.

Further, in the circuit device according to the present invention, said signal processing circuit may comprise a plurality of said second delay circuits, and wherein said signal processing circuit further may comprise a logic circuit having an inputting portion for receiving outputted data from one second delay circuit of said plurality of second delay circuits and an outputting portion for outputting data to another second delay circuit of said plurality of second delay circuits. In this case, said one second delay circuit may have a plurality of data outputting portions, wherein said another second delay circuit may have a plurality of data inputting portions, and wherein said logic circuit may have a plurality of inputting portions for receiving outputted data from said plurality of data outputting portions of said one second delay circuit and a plurality of outputting potions for outputting data to said plurality of data inputting portions of said another second delay circuit.

Further, it is preferable that, in the circuit device according to the present invention, said control circuit comprises a deciding circuit for deciding whether said second delay circuit should be supplied with said pulse of said clock signal on the basis of whether said outputted data from said first delay circuit in response to said pulse of said clock signal is equal to said data to be outputted from said first delay circuit in response to the next pulse and a clock driver for allowing or blocking supply of said pulse of said clock signal to said second delay circuit in accordance with a decision of said deciding circuit.

By providing with such control device, it is able to allow or block the supply of said pulse of said clock signal to said second delay circuit.

The deciding circuit may comprise a judging section for judging whether said outputted data from said first delay circuit in response to each pulse of said clock signal is equal to said data to be outputted in said first delay circuit in response to the next pulse, a counter for incrementing a count value when said judging section judges both data to be equal and resetting a counter value when said judging section judges both data not to be equal and a control signal generating section for comparing said count value with a comparison value to obtain a comparison result and for outputting, on the basis of said comparison result, a pulse supply controlling signal representing whether said second delay circuit should be supplied with said pulse of said clock signal. In this case, said comparison value may correspond to a total number of said second delay circuits.

Further, in the circuit device according to the present invention, each of said first delay circuits and second delay circuits may be constructed by one or more D flip-flops.

DESCRIPTION OF THE PREFERRED EMBODIMENTS

Hereinafter, the embodiments of the present invention will be described.

Figure 1:
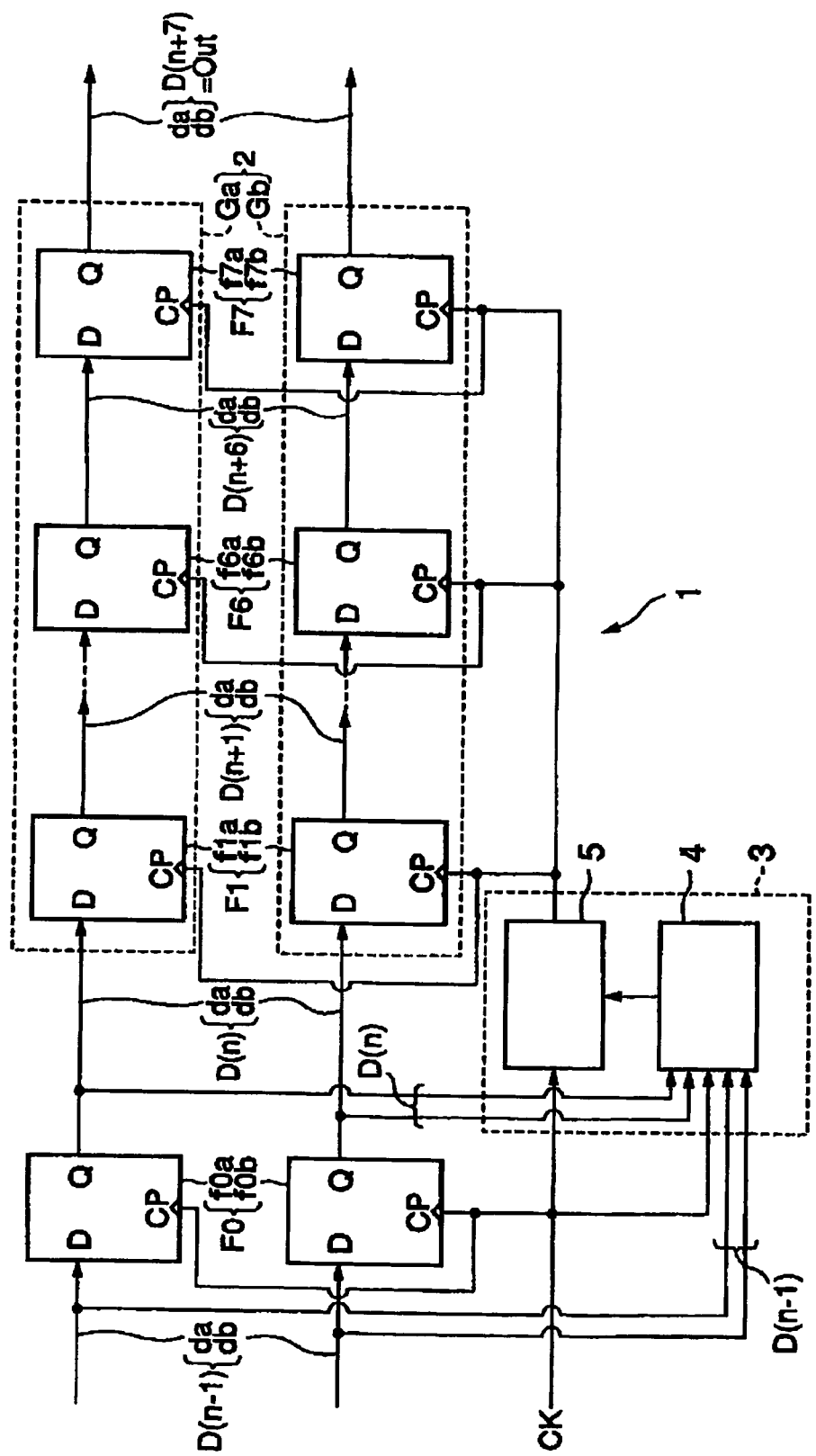
FIG. 1 is a block diagram showing a circuit device of a first embodiment according to the present invention.

FIG. 1 is a block diagram showing a circuit device of a first embodiment according to the present invention.

Data signal D(n−1) consisting of 2 bits of data (da, db) is inputted in the circuit device 1 shown in FIG. 1. The circuit device 1 operates so as to output the inputted data signal D(n−1) as a data signal D(n+7) (=Out) which is delayed by 8 pulse periods (8 clock periods) with respect to the inputted data signal D(n−1).

The circuit device 1 comprises D flip-flops f0a and f0b. At the succeeding side of the D flip-flop f0a, a group Ga of seven cascaded D flip-flops f1a to f7a is connected to the D flip-flop f0a. Further, at the succeeding side of the D flip-flop f0b, a group Gb of seven cascaded D flip-flops f1b to f7b is connected to the D flip-flop f0b. A shift register 2 is constructed by the groups Ga and Gb. Each of the D flip-flops f0a to f7a and f0b to f7b comprises a data inputting terminal D for receiving data, a data outputting terminal Q for outputting the data inputted to the data inputting terminal D, and a clock signal inputting terminal CP for receiving a clock signal CK. In the circuit device 1, da of the 2 bits of data (da, db) is processed by the D flip-flops f0a to f7a and db of the data (da, db) is processed by the D flip-flops f0b to f7b. In this embodiment, each of the groups Ga and Gb comprises the construction of the cascaded seven D flip-flops, but the number of the cascaded D flip-flops may be changed as required. Hereinafter, a pair of D flip-flops f0a and f0b is merely referred to as D flip-flop F0. Similarly, a pair of D flip-flops f1a and f1b, a pair of D flip-flops f7a and f7b are merely referred to as D flip-flop F1, F7, respectively.

The circuit device 1 comprises a control circuit 3. The power consumption of the shift register 2 can be reduced by providing the circuit device 1 with the control circuit 3. The reason why the circuit device 1 shown in FIG. 1 can reduce the power consumption of the shift register 2 is described below by comparing the circuit device 1 with a circuit device having no control circuit 3.

Figure 2:
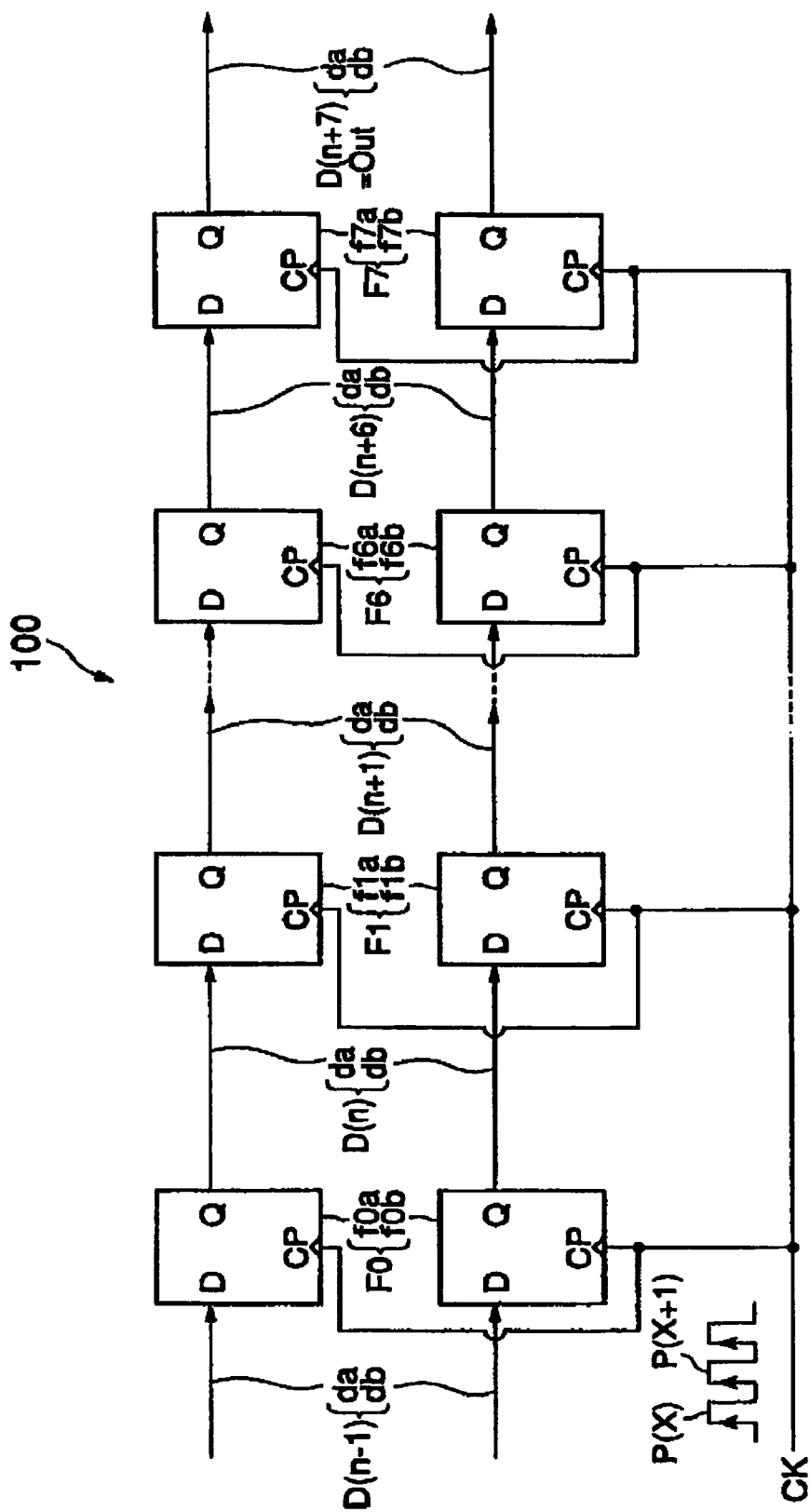
FIG. 2 shows a circuit device 100 without the control circuit 3.

FIG. 2 shows a circuit device 100 without the control circuit 3.

In response to the rise edge of the pulse Px of the clock signal CK, the D flip-flop f0a of the front D flip-flop F0 introduces the data da inputted to the data inputting terminal D thereinto and then continues to output the introduced data da from the data outputting terminal Q to the next D flip-flop f1a until the time when the next pulse P(x+1) generates. Therefore, the D flip-flop f0a outputs the inputted data da after 1 pulse period (1 clock period) delay. The D flip-flop f0b operates similarly to the D flip-flop f0a to output the inputted data db after 1 pulse period delay. Therefore, the D flip-flop F0 outputs the inputted data signal D(n−1) to the next D flip-flop F1 as a data signal D(n) delayed by 1 pulse period with respect to the data signal D(n−1).

In response to the rise edge of the pulse Px of the clock signal CK, the D flip-flop f1a of the D flip-flop F1 introduces the data da from the preceding D flip-flop f0a thereinto and then continues to output the introduced data da to the next D flip-flop f2a (not shown) until the time when the next pulse P(x+1) generates. Therefore, the D flip-flop f1a outputs, after 1 pulse period delay, the data da outputted from the preceding D flip-flop f0a. The D flip-flop f1b also outputs, after 1 pulse period delay, the data db outputted from the preceding D flip-flop f0b. Therefore, the D flip-flop F1 outputs the data signal D(n) outputted from the preceding D flip-flop F0 as a data signal D(n+1) delayed by 1 pulse period with respect to the data signal D(n).

Similarly, each of the D flip-flops F2 to F7 outputs the data outputted from the preceding D flip-flop as a data signal delayed by 1 pulse period. Therefore, the data signal D(n−1) inputted to the front D flip-flop F0 is outputted from the end D flip-flop F7 as a data signal D(n+7) (=Out) delayed by 8 pulse period with respect to the data signal D(n−1).

Figure 3:
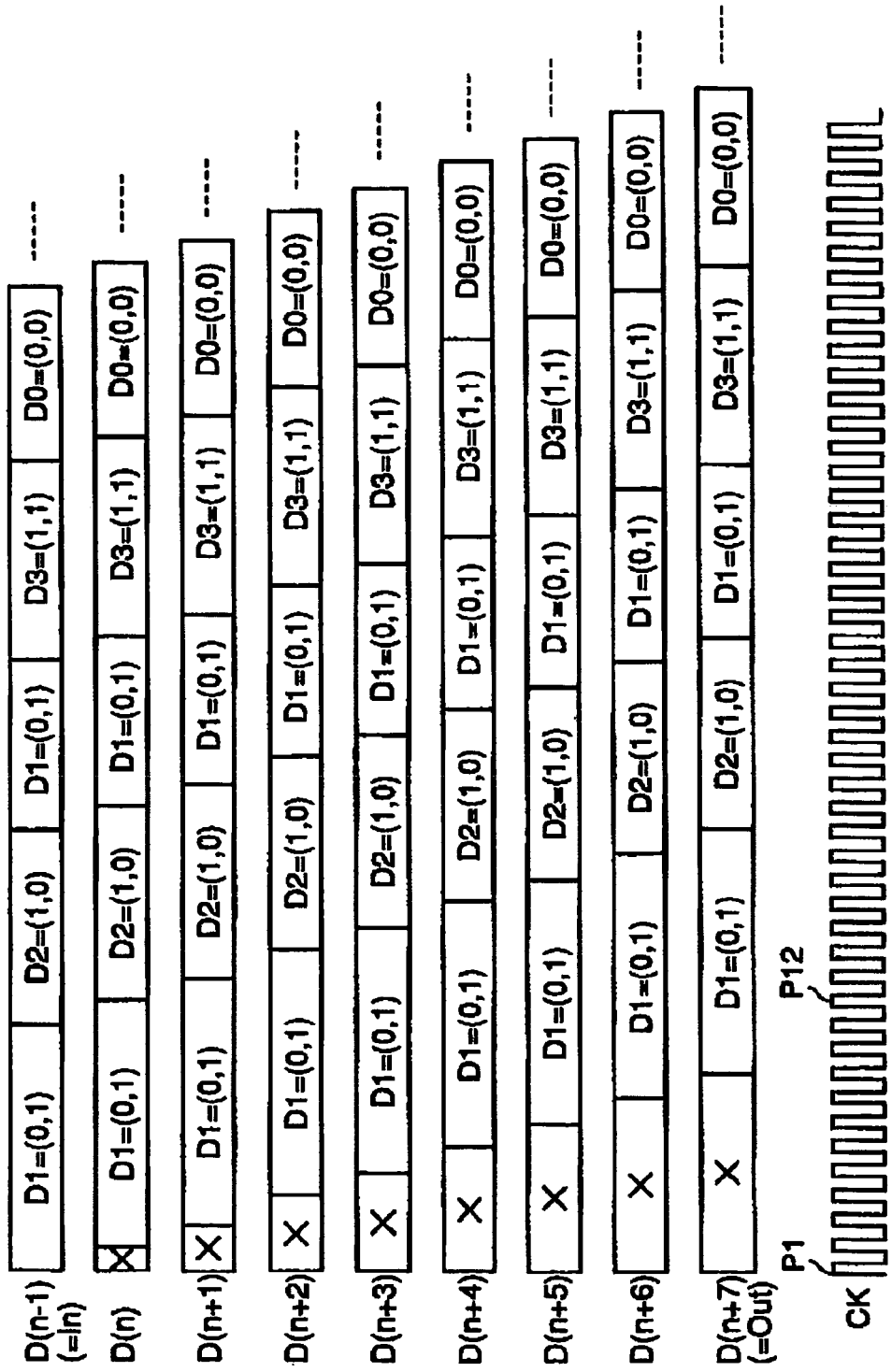
FIG. 3 shows a timing chart of the circuit device 100 without the control circuit 3 shown in FIG. 2.

FIG. 3 shows a timing chart of the circuit device 100 without the control circuit 3 shown in FIG. 2.

The data da and db are logic '0' or '1', so that D(n−1)=(da, db) can take four values, i.e. D0=(0,0), D1=(0,1), D2=(1,0), and D3=(1,1) as shown in FIG. 3. For example, if the D(n−1) is equal to D1=(0,1), '0' is introduced into the D flip-flop f0a and '1' is introduced into the D flip-flop f0b in response to the pulse P of the clock signal CK. The introduced data signal D(n−1) is outputted to the next D flip-flop F1. Similarly, D1=(0,1) is sequentially outputted to the D flip-flops F2, . . . , F7 in response to the pulse of the clock signal and is finally outputted as the data signal D(n+7) (=Out).

Figure 4:
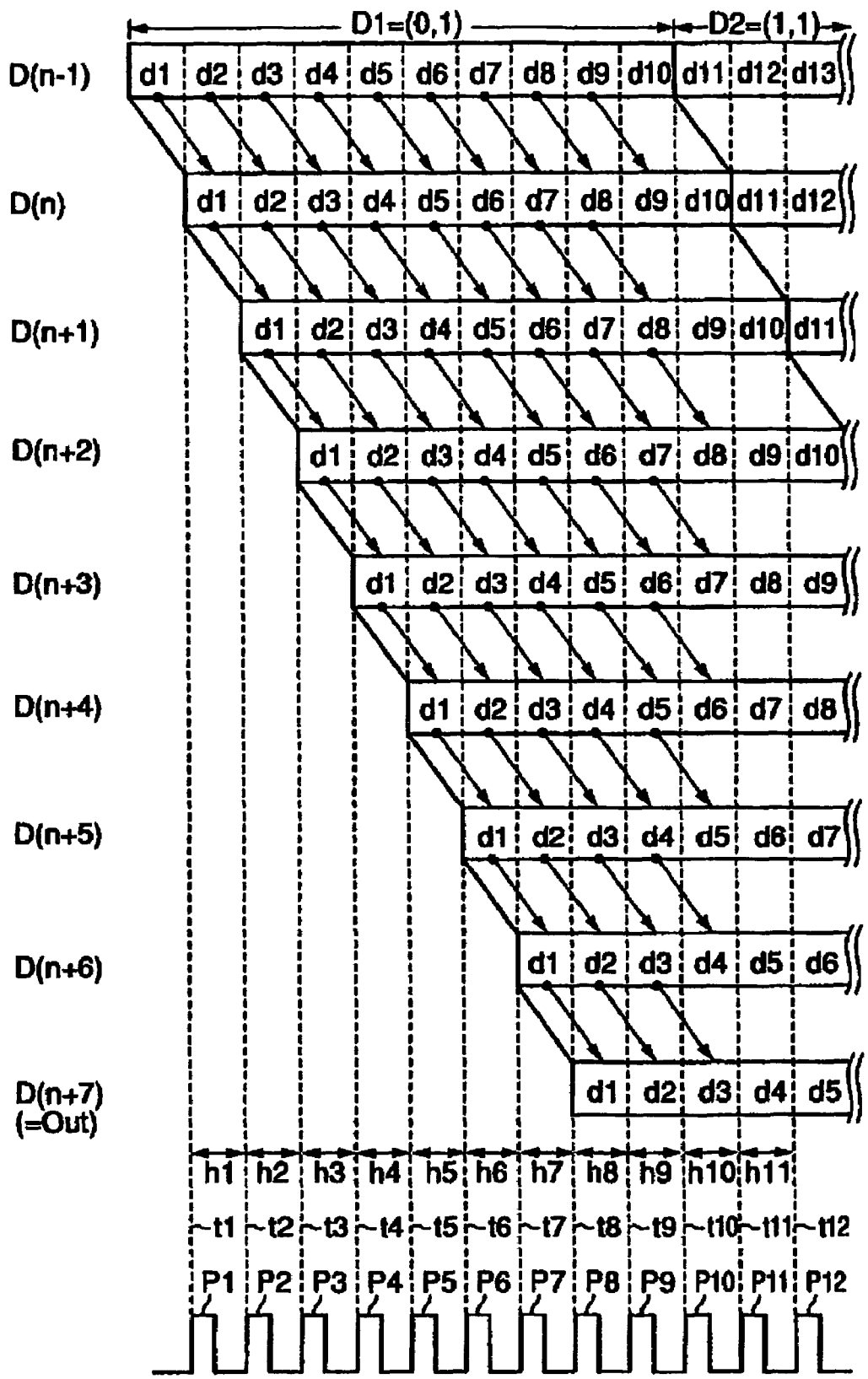
FIG. 4 is a partially enlarged view of the timing chart shown in FIG. 3 between a pulse P1 and a pulse P12.

FIG. 4 is a partially enlarged view of the timing chart shown in FIG. 3 between a pulse P1 and a pulse P12.

In response to the rise edge of the pulse P1 of the clock signal CK, the D flip-flop F0 introduces the data d1 of the data signal D(n−1) thereinto and then outputs the introduced data d1 as the data signal D(n). When the next pulse P2 is generated, the D flip-flop F0 introduces the data d2 of the data signal D(n−1) thereinto and then outputs the data d2 instead of d1 as the data signal D(n).

Similarly, in response to pulses P3, P4, . . . , the D flip-flop F0 introduces the data d3, d4, . . . of the data signal D(n−1) thereinto respectively and then continues to output the introduced data as the data signal D(n) until the time when the next pulse generates. Namely, the D flip-flop F0 continues to output the introduced data d1, d2, . . . , dx during the pulse periods (clock periods) h1, h2, . . . , hx of the pulse P1, P2, . . . , Px, respectively. Therefore, the D flip-flop F0 outputs the data d1, d2, . . . , dx of the inputted data signal D(n−1) as the data d1, d2, . . . , dx of the data signal D(n) delayed by 1 pulse period with respect to the data signal D(n−1).

The data d1, d2, . . . , dx of the outputted data signal D(n) from the D flip-flop F0 are inputted to the next D flip-flop F1. The D flip-flop F1 outputs the data d1, d2, . . . , dx of the inputted data signal D(n) as the data d1, d2, . . . , dx of the data signal D(n+1) delayed by 1 pulse period with respect to the data signal D(n).

Similarly, each of further D flip-flops F2 to F7 outputs the data of the inputted data signal as the data of the data signal delayed by 1 pulse period. As described above, each of the D flip-flops F1 to F7 delays the inputted data by 1 pulse period, so that the circuit device 100 shown in FIG. 3 can output the data signal D(n+7) which is delayed by 8 pulse periods with reference to the data signal D(n−1). However, the problem with the circuit device 100 shown in FIG. 3 is that the power consumption is high since each of the D flip-slops F0 and F7 is continuously supplied with the pulses P of the clock signal CK. The problem of high power consumption grows with the increasing of the number of the D flip-flops. For solving the problem, the inventor has thought out the circuit device 1 of FIG. 1 which can reduce power consumption. The circuit device 1 controls whether the shift register 2 should be supplied with the pulse of the clock signal on the basis of the data signal D(n−1) inputted to the D flip-flop F0 and the data signal D(n) outputted from the D flop-flop F0. Through such control, the circuit device 1 shown in FIG. 1 can reduce power consumption of the shift register 2 while outputting the data signal identical with the data signal D(n+7) (=Out) outputted from the circuit device 100 shown in FIG. 3. Hereinafter, the principle of the circuit device thought out by the inventor is described.

When the D flip-flop F0 is supplied with the pulse P1, the D flip-flop F0 introduces the data d1 of the data signal D(n−1) thereinto and then continues to output the introduced data d1 as the data d1 of the data signal D(n) until the time when the D flip-flop F0 is supplied with the next pulse P2. When the D flip-flop F0 is supplied with the pulse P2, the D flip-flop F0 introduces the data d2 of the data signal D(n−1) thereinto and then continues to output the lately introduced data d2 instead of the data d1 as the data d2 of the data signal D(n) until the time when the D flip-flop F0 is supplied with the next pulse P3. Therefore, the D flip-flop F0 outputs the data d1 during the pulse period h1 in which the pulse P1 generates and outputs the data d2 during the pulse period h2 in which the pulse P2 generates. As described above, the D flip-flop has the property of continuing to output the data introduced in response to each pulse Px until the time when the D flip-flop is supplied with the next pulse. In the present invention, attention is directed to this property of D flip-flop. For example, assuming that the D flip-flop F0 is supplied with the pulse P1 but is not supplied with the next pulse P2, the D flip-flop F0 continues to output the data d1 of the data signal D(n−1) as the data of the data signal D(n) during not only the pulse period hi but also the next pulse period h2. Namely, even if the D flip-flop F0 is not supplied with the pulse P2, the data d1 which is outputted from the D flip-flop F0 during the pulse period h1 continues to be outputted from the D flip-flop F0 during the next pulse period h2, so that the data of the data signal D(n) during the pulse period h2 has the same value (=d1) as the data of the data signal D(n) during the pulse period h1. Therefore, if the data d2 of the data signal D(n−1) is equal to the data d1 of the data signal D(n−1) (d2=d1=d), the data of the data signal D(n) during the pulse period h2 has the same value (=d) as the data of the data signal D(n) during the pulse period h1 regardless of whether the D flip-flop F0 is supplied with the next pulse P2 after the pulse P1.

From a consideration described above, it can be understood that, if the data dx of the data signal D(n−1) is equal to the preceding data dx−1 of the data signal D(n−1) (dx=dx−1=d), the data of the data signal D(n) during the pulse period hx has the same value (=d) as the data of the data signal D(n) during the pulse period hx−1 regardless of whether the D flip-flop F0 is supplied with the next pulse Px after the pulse Px−1.

The above elucidation is given to the data signal D(n) outputted from the D flip-flop F0, but the similar elucidations can be given to the data signals D(n+1) to D(n+7) (=Out) outputted from the D flip-flops F1 to F7 respectively.

Therefore, for example, in the data signal D(n+7) (=Out) outputted from the end D flip-flop F7, if the data of the signal D(n+7) during the pulse period hx is equal to the data of the signal D(n+7) during the preceding pulse period hx-1, it is understood that if the supply of the pulse Px to the end D flip-flop F7 is blocked, the circuit device 1 can reduce the power consumption of the shift register 2 with the identity of the data signal D(n+7) (=Out) kept. See FIG. 4. In the data signal D(n+7) (=Out), the data d2 of the signal D(n+7) during the pulse period h9 is D1=(0,1) and the data d1 of the signal D(n+7) during the immediately preceding pulse period h8 is also D1=(0,1). Therefore, in the data signal D(n+7) (=Out), the data of the signal D(n+7) during the pulse period h9 is equal to the data of the signal D(n+7) during the immediately preceding pulse period h8. Therefore, when the circuit device 1 blocks the supply of the pulse P9 to the end D flip-flop F7, the circuit device 1 can reduce the power consumption of the shift register 2 while keeping the identity of the data signal D(n+7) (=Out) outputted from the end D flip-flop.

Similarly, in the data signal D(n+6) outputted from the D flip-flop F6, for example, the data d3 of the signal D(n+6) during the pulse period h9 is D1=(0,1) and the data d2 of the signal D(n+6) during the immediately preceding pulse period h8 is also D1=(0,1). Therefore, in the data signal D(n+6), the data of the signal D(n+6) during the pulse period h9 is equal to the data of the signal D(n+6) during the immediately preceding pulse period h8. Therefore, when the circuit device 1 blocks the supply of the pulse P9 to the D flip-flop F6, the circuit device 1 can reduce the power consumption of the shift register 2 while keeping the identity of the data signal D(n+6) outputted from the D flip-flop F6. Similarly, in the data signals outputted from further D flip-flops, when the circuit device 1 blocks the supply of the pulse P9 to further D flip-flops, the circuit device 1 can reduce the power consumption of the shift register 2 while keeping the identity of data signal outputted from further D flip-flops.

It should be noted that the circuit device 1 is allowed to block the supply of the pulse P9 in the only case where "even if the supply of the pulse P9 to the D flip-flop is blocked, the D flip-flop outputs the same data as outputted from the D flip-flop supplied with the pulse P9". Therefore, when the circuit device 1 shown in FIG. 1 tries to block the sup ply of the pulse P9 to the D flip-flop, the device 1 must know "even if the supply of the pulse P9 to the D flip-flop is blocked, the D flip-flop outputs the same data as outputted from the D flip-flop supplied with the pulse P9" before the time t9 when the supply of the pulse P9 starts. It is described how the circuit device 1 can know "even if the supply of the pulse P9 to the D flip-flop is blocked, the D flip-flop outputs the same data as outputted from the D flip-flop supplied with the pulse P9".

The situation in which "even if the supply of the pulse P9 to the D flip-flop is blocked, the D flip-flop outputs the same data as outputted from the D flip-flop supplied with the pulse P9" is achieved under the condition that "the data of each data signal during the pulse period h9 is equal to the data of the same data signal during the immediately preceding pulse period h8". Therefore, if the circuit device 1 shown in FIG. 1 can know "the data of each data signal during the pulse period h9 is equal to the data of the same data signal during the immediately preceding pulse period h8" before the time t9 when the supply of the pulse P9 starts, the device 1 can block the supply of the pulse P9 with the identity of the data signal kept. It is described how the circuit device 1 shown in FIG. 1 can know "the data of each data signal during the pulse period h9 is equal to the data of the same data signal during the immediately preceding pulse period h8" before the time t9 when the supply of the pulse P9 starts.

First, the data signal D(n+7) (=Out) is discussed.

The data d2 of the data signal D(n+7) during the pulse period h9 is outputted from the end D flip-flop F7 and is delayed by 8 pulse periods with respect to the data d2 of the data signal D(n−1) during the pulse period h1 inputted to the front D flip-flop F0. Further, the data d1 of the data signal D(n+7) (=Out) during the pulse period h8 is outputted from the end D flip-flop F7 and is delayed by 7 pulse periods with respect to the data d1 of the data signal D(n) during the pulse period h1 outputted from the front D flip-flop F0 (i.e. inputted to the D flip-flop F1). Therefore, if it can be recognized that the data d2 of the data signal D(n−1) during the pulse period h1 is equal to the data d1 of the data signal D(n) during the pulse period h1, it turns out that the data of the data signal D(n+7) (=Out) during the pulse period h9 is equal to the data of the data signal D(n+7) during the previously preceding pulse period h8.

Next, the data signal D(n+6) is discussed.

The data d3 of the data signal D(n+6) during the pulse period h9 is outputted from the D flip-flop F6 and is delayed by 7 pulse periods with respect to the data d3 of the data signal D(n−1) during the pulse period h2 inputted to the front D flip-flop F0. Further, the data d2 of the data signal D(n+6) during the pulse period h8 is outputted from the D flip-flop F6 and is delayed by 6 pulse periods with respect to the data d2 of the data signal D(n) during the pulse period h2 outputted from the front D flip-flop F0 (i.e. inputted to the D flip-flop F1). Therefore, if it can be recognized that the data d3 of the data signal D(n−1) during the pulse period h2 is equal to the data d2 of the data signal D(n) during the pulse period h2, it turns out that the data of the data signal D(n+6) during the pulse period h9 is equal to the data of the data signal D(n+6) during the previously preceding pulse period h8. Other data signals can be discussed in a like manner. For example, if it can be recognized that the data d8 of the data signal D(n−1) during the pulse period h7 is equal to the data d7 of the data signal D(n) during the pulse period h7, it turns out that the data of the data signal D(n+1) during the pulse period h9 is equal to the data of the data signal D(n+1) during the previously preceding pulse period h8.

From the viewpoint described above, if it can be recognized that the data signal D(n−1) is equal to the data signal D(n) over the successive seven pulse periods h1 to h7, it turns out that, in each of the data signals D(n+1) to D(n+7) (=Out), the data during the pulse period h9 is equal to the data during the previously preceding pulse period h8.

The above elucidation refers to the data of the data signals D(n+1) to D(n+7) (=Out) during the pulse periods h9 and h8. Similarly, in the case of the data of the data signals D(n+1) to D(n+7) (=Out) during the pulse periods h10 and h9, if it can be recognized that the data signal D(n−1) is equal to the data signal D(n) over the successive seven pulse periods h2 to h8, it turns out that, in each of the data signals D(n+1) to D(n+7) (=Out), the data during the pulse period h10 is equal to the data during the previously preceding pulse period h9.

Therefore, if the data signals D(n−1) and D(n) are equal to each other over the successive seven pulse periods in the circuit device 1, each of the data signals D(n+1) to D(n+7) keeps its own identity even if the supply of the pulse to the seven D flip-flops F1 to F7 is blocked, so that it is possible to greatly reduce the power consumption of the circuit device 1 while keeping the identities of respective data signals D(n+1) to D(n+7) (=Out).

In order to achieve such great reduction of the power consumption, the circuit device 1 needs to operate so as to know whether the data signal D(n−1) is equal to the data signal D(n) over the successive seven pulse periods or not, and then block the supply of the pulse P9 to the D flip-flops F1 to F7 if the data signal D(n−1) is equal to the data signal D(n).

For this purpose, the circuit device 1 is provided with the control circuit 3 for realizing such operation.

Figure 5:
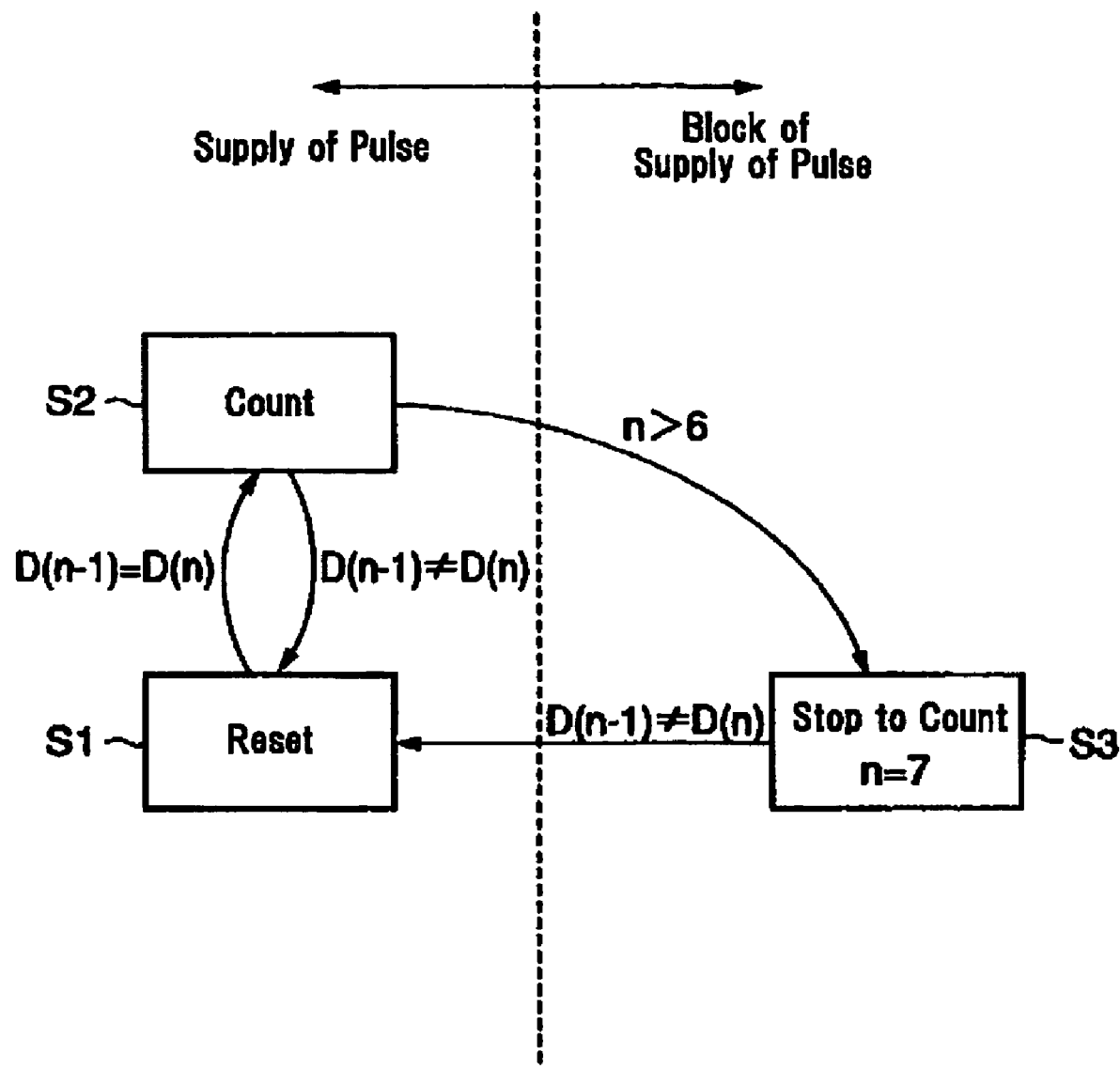
FIG. 5 shows a state transition diagram of the control circuit 3.

FIG. 5 shows a state transition diagram of the control circuit 3.

The control circuit 3 judges weather the data signals D(n−1) is equal to the data signal D(n) every each pulse period h. If D(n−1) is equal to D(n), the control circuit 3 increments a counter value nc by one in a step S2, otherwise (i.e. if D(n−1) is not equal to D(n)), the control circuit 3 returns to a step S1 and resets the count value nc. If the control circuit 3 is in the step S1 or S2, seven D flip-flops F1 to F7 are supplied with the pulse. On the other hand, if the incremented count value nc reaches 7 (i.e. nc=7), nc=7 means that the data signal D(n−1) is equal to the data signal D(n) over the successive seven pulse periods, so that the control circuit 3 goes from the step S2 to a step S3 and blocks the supply of the pulse to the seven D flip-flops F1 to F7. If the relationship between D(n−1) and D(n) is changed to D(n−1)≠D(n) in the step S3, the control circuit 3 returns to the step S1 and resets the count value nc. If the control circuit 3 operates as described above, the circuit device 1 can achieve the greatly reduced power consumption while keeping the identities of respective data signals D(n+1) to D(n+7) (=Out) when the supply of the pulse to the seven D flip-flops F1 to F7 is blocked.

The circuit operation of the circuit device 1 provided with such control circuit 3 is specifically described below.

Figure 6:
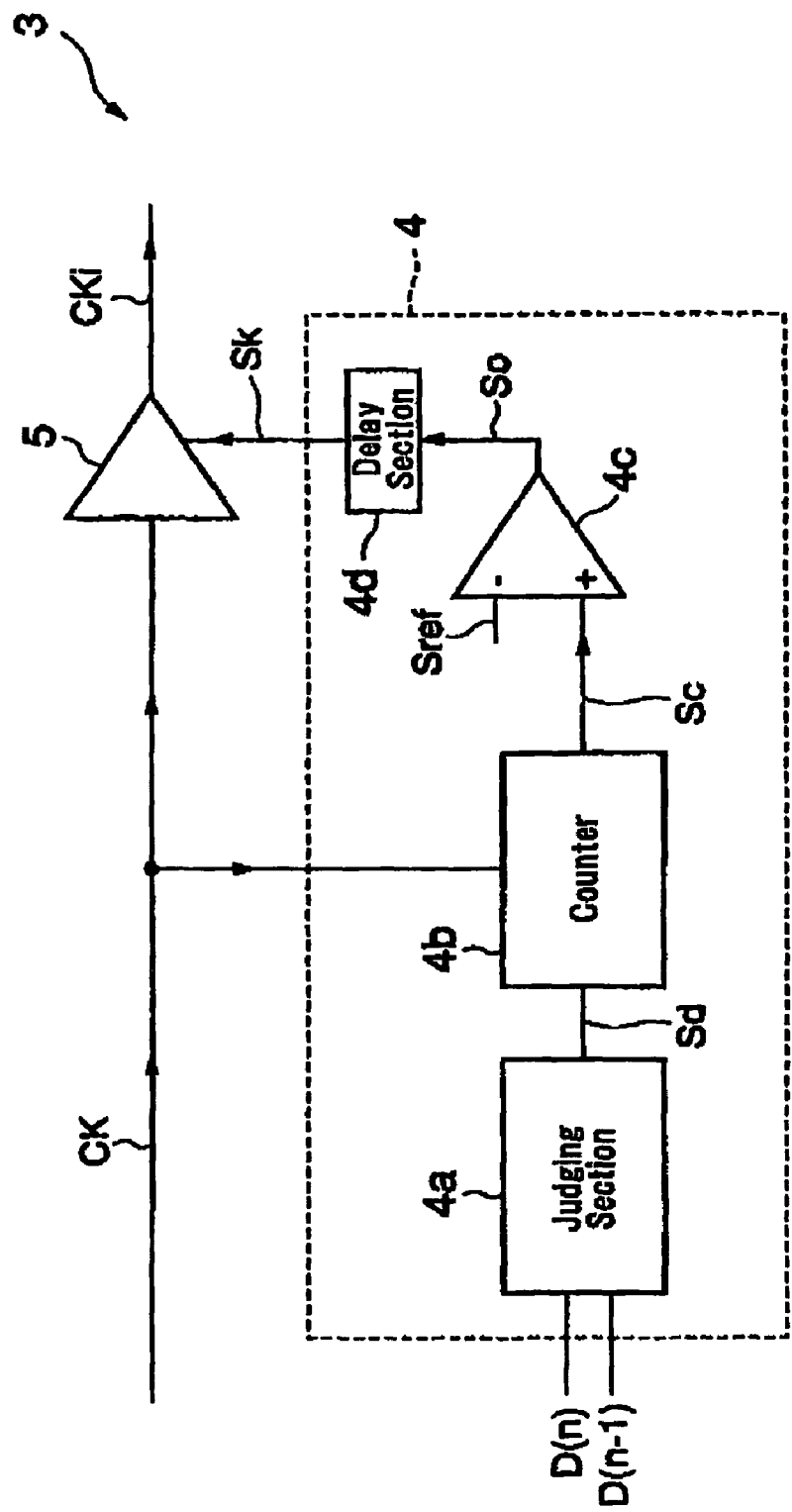
FIG. 6 is a detail view of the control circuit 3.
Figure 7:
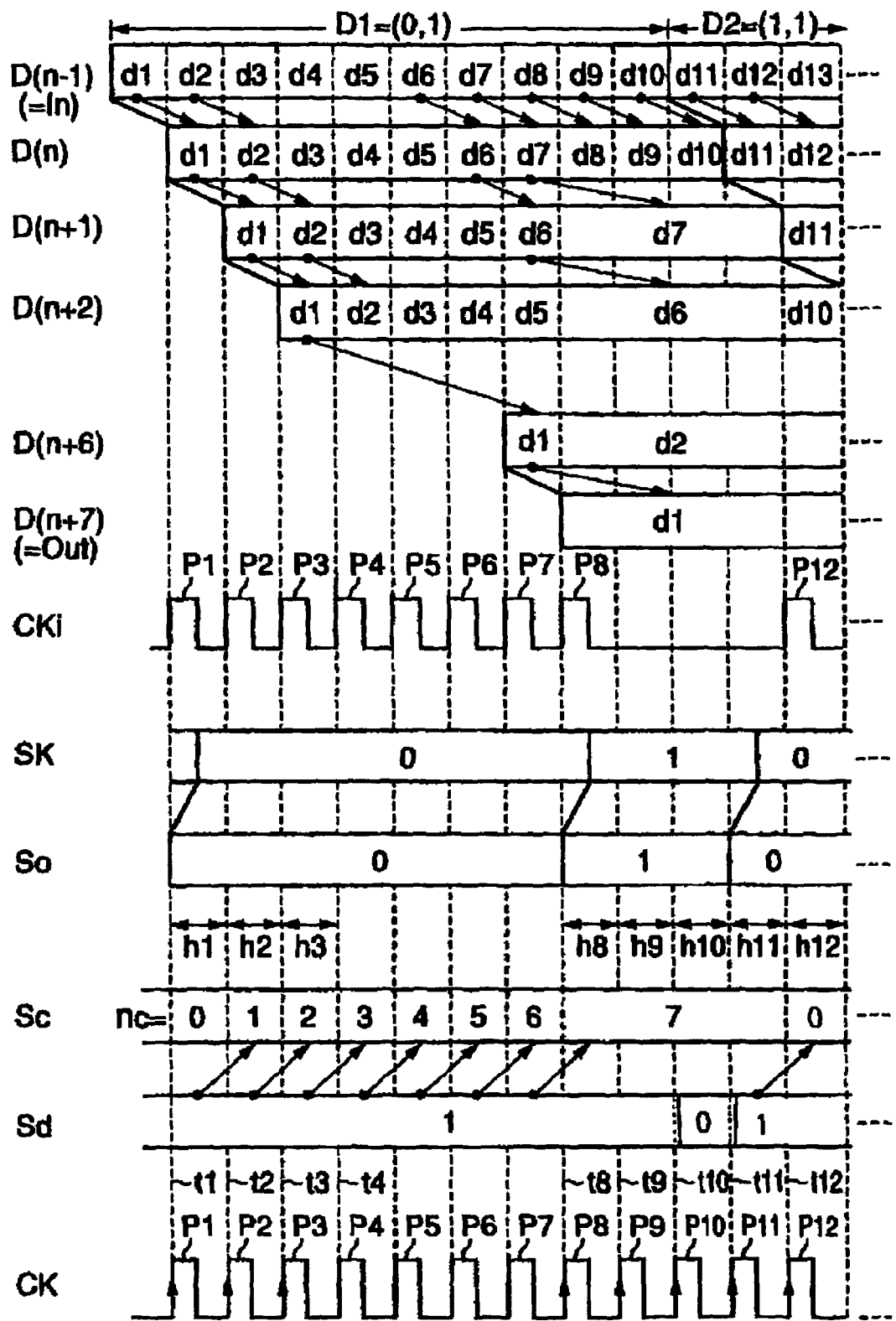
FIG. 7 shows a timing chart of the signal associated with the operation of the circuit device 1 shown in FIG. 1.

FIG. 6 is a detail view of the control circuit 3. FIG. 7 shows a timing chart of the signal associated with the operation of the circuit device 1 shown in FIG. 1.

The control circuit 3 comprises a deciding circuit 4. The deciding circuit 4 judges whether the data signals D(n−1) and D(n) are equal to each other and then outputs a signal Sk representing whether the D flip-flops F1 to F7 should be supplied with the clock signal CK. The deciding circuit 4 comprises a judging section 4a. The judging section 4a receives the data signal D(n−1) inputted to the D flip-flop F0 and the data signal D(n) outputted from the D flip-flop F0. The judging section 4a judges whether the data signals D(n−1) and D(n) are equal to each other. The judging section 4a outputs the judging signal Sd of the logic '1' if the data signals D(n−1) and D(n) are equal to each other and outputs the judging signal Sd of the logic '0' if the data signals D(n−1) and D(n) are different from each other. The outputted judging signal Sd from the judging section 4a is inputted to a counter 4b.

In the counter 4b, if the judging signal Sd is the logic '1' (i.e. the data signals D(n−1) and D(n) are equal to each other), the count value nc is incremented in response to the pulse P of the clock signal CK and a count signal Sc representing the incremented count value nc is outputted. On the contrary, if the judging signal Sd is the logic '0' (i.e. the data signals D(n−1) and D(n) are different from each other), the count value nc is reset in response to the pulse P of the clock signal CK and a count signal Sc representing a reset value (n=0) is outputted. The outputted count signal Sc from the counter 4b is inputted to a comparator 4c.

The comparator 4c receives not only the outputted count signal Sc from the counter 4b but also a comparison signal Sref. The comparison signal Sref represents a comparison value nr=6 compared with the count value nc. The comparator 4c outputs a result signal So of the logic '0' if the count value nc is smaller than or equal to the comparison value nr=6 (nc·nr) and outputs a result signal So of the logic '1' if the count value nc is greater than the comparison value nr=6 (nc>nr).

The deciding circuit 4 comprises a delay section 4d. The delay section 4d delays the outputted result signal So from the comparator 4c by a half pulse period. The delay section 4d outputs the half pulse period delayed result signal So as a control signal Sk for controlling the operation of the clock driver 5.

The clock driver 5 supplies the D flip-flops F1 to F7 with the pulse of the clock signal CK as a pulse of an internal clock signal CKi if the control signal Sk is logic '0' (i.e. nc·nr), but blocks the supply of the pulse of the clock signal CK to the D flip-flops F1 to F7 if the control signal Sk is the logic '1' (i.e. nc>nr).

The operation of the circuit device 1 provided with such control circuit 3 is described below in detail with reference to the FIGS. 1, 6 and 7.

First, the data d1 of the data signal D(n−1) is inputted to the data inputting terminal D of the D flip-flop F0. The data d1 of the data signal D(n−1) is introduced within the D flip-flop F0 in response to the pulse P1 of the clock signal CK and the introduced data d1 is outputted to the next flip-flop F1. The next data d2 of the data signal D(n−1) is inputted to the D flip-flop F0 while the D flip-flop F0 outputs the data d1 to next flip-flop F1. Further, the outputted data d1 from the D flip-flop F0 and the next data d2 inputted to the D flip-flop F0 are inputted to the judging section 4a of the deciding circuit 4. Therefore, both data d2 of the data signal D(n−1) and data d1 of the data signal D(n) are inputted to the judging section 4a during the pulse period h1 (see FIG. 7). The judging section 4a judges whether the data d2 and d1 are equal. Since both data d2 and d1 are D1=(0,1), the data d2 is equal to the data d1. Therefore, the judging section 4a outputs the judging signal Sd of the logic '1' representing D(n−1)=D(n) to the counter 4b during the pulse period h1. Assume that, during the pulse period h1, the count value nc of the counter 4b is zero (nc=0) and the control signal Sk is the logic '0'. Therefore, it is noted that the clock driver 5 supplies each of the D flip-flops F1 to F7 with the pulse of the clock signal CK as the pulse of the internal clock signal CKi.

When the circuit device 1 is supplied with the pulse P1, the circuit device 1 operates as described above.

Next, the case in which the circuit device 1 is supplied with the pulse P2 of the clock signal CK is discussed.

This pulse P2 is inputted to the D flip-flop F0 and the clock driver 5. Since the control signal Sk of the logic '0' is being inputted to the clock driver 5 at the time t2 of the rise edge of the pulse P2, the clock driver 5 supplies the D flip-flops F1 to F7 with the pulse P2 as the pulse P2 of the internal clock signal CKi. Therefore, the pulse P2 is supplied to not only the D flip-flop F0 but also the D flip-flops F1 to F7. In response to the rise edge of the pulse P2, the D flip-flop F0 introduces the data d2 of the data signal D(n−1) thereinto and then outputs the introduced data d2. Further, in response to the rise edge of the pulse P2, the next D flip-flop F1 introduces the outputted data d1 of the data signal D(n) from the preceding D flop-flop F0 and then outputs the introduced data d1. Similarly, in response to the rise edge of the pulse P2, each of the other D flip-flops F2 to F7 introduces the outputted data from the preceding D flop-flop and then outputs the introduced data.

The pulse P2 is also inputted to the counter 4b of the deciding circuit 4. Depending on whether the judging signal Sd being inputted to the counter 4b is the logic '0' or '1', the counter 4b resets or increments the count value nc in response to the rise edge of the pulse P2. Since the judging signal Sd is the logic '1' (i.e. d2=d1) at the time t2 of the rise edge of the pulse P2, the counter 4b increments the count value nc, so that nc becomes 1 (i.e. nc=1). The count value nc=1 means that D(n−1) is equal to D(n) during the pulse period h1 (namely, in the data signal D(n+7), the data during the pulse period h9 is equal to the data during pulse period h8). The counter 4b outputs the count signal Sc representing the count value nc=1 to the comparator 4c.

Since the count value nc is 1 (i.e. nc=1), nc is smaller than nr (i.e. nc<nr). Therefore, the comparator 4c outputs the result signal So of the logic '0' meaning that the count value nc is equal to or smaller than the comparison value nr (=6) to the delay section 4d during the pulse period h2.

The delay section 4d delays the result signal So by a half pulse period and then outputs the half pulse period delayed result signal So to the clock driver 5 as the control signal Sk.

While the D flip-flop F0 outputs the data d2 to the next flip-flop F1, the D flip-flop F0 receives the next data d3 of the data signal D(n−1). The outputted data d2 from the D flip-flop F0 and the next data d3 inputted to the D flip-flop F0 are inputted to the judging section 4a of the deciding circuit 4. Therefore, the judging section 4a receives the data d3 of the data signal D(n−1) and the data d2 of the data signal D(n) during the pulse period h2 (see FIG. 7). The judging section 4a judges whether the data d3 is equal to the data d2. Both data d3 and d2 are D1=(0,1), so that the data d3 is equal to the data d2. Therefore, the judging section 4a outputs, during the pulse period h2, the judging signal Sd of the logic '1' representing D(n−1) is equal to D(n) to the counter 4b.

When the circuit device 1 is supplied with the pulse P2, the circuit device 1 operates as described above.

Next, the case in which the circuit device 1 is supplied with the pulse P3 of the clock signal CK is discussed.

This pulse P3 is inputted to the D flip-flop F0 and the clock driver 5. Since the control signal Sk of the logic '0' is being inputted to the clock driver 5 at the time t3 of the rise edge of the pulse P3, the clock driver 5 supplies the D flip-flops F1 to F7 with the pulse P3 as the pulse P3 of the internal clock signal CKi. Therefore, the pulse P3 is supplied to not only the D flip-flop F0 but also the D flip-flops F1 to F7. In response to the pulse P3, the D flip-flop F0 introduces the data d3 of the data signal D(n−1) thereinto and then outputs the introduced data d3 to the next flip-flop F1. Similarly, in response to the rise edge of the pulse P3, each of the other D flip-flops F1 to F7 introduces the outputted data from the preceding D flop-flop and then outputs the introduced data.

The pulse P3 is also inputted to the counter 4b of the deciding circuit 4. Depending on whether the judging signal Sd being inputted to the counter 4b is the logic '0' or '1', the counter 4b resets or increments the count value nc in response to the rise edge of the pulse P3. Since the judging signal Sd is the logic '1' (i.e. d3=d2) at the time t3 of the rise edge of the pulse P3, the counter 4b increments the count value nc in response to the rise edge of the pulse P3, so that nc becomes 2 (i.e. nc=2). The count value nc=2 means that D(n−1) is equal to D(n) during the successive two pulse periods h1 and h2 (namely, in each of the data signals D(n+6) and D(n+7), the data during the pulse period h9 is equal to the data during pulse period h8). The counter 4b outputs the count signal Sc representing the count value nc=2 to the comparator 4c.

Since the count value nc is 2 (i.e. nc=2), nc is smaller than nr (i.e. nc<nr). Therefore, the comparator 4c outputs the result signal So of the logic '0' meaning that the count value nc is equal to or smaller than the comparison value nr(=6) to the delay section 4d during the pulse period h3.

The delay section 4d delays the result signal So by a half pulse period and then outputs the half pulse period delayed result signal So to the clock driver 5 as the control signal Sk.

While the D flip-flop F0 outputs the data d3 to the next flip-flop F1 in response to the pulse P3, the D flip-flop F0 receives the next data d4 of the data signal D(n−1). The outputted data d3 from the D flip-flop F0 and the next data d4 inputted to the D flip-flop F0 are inputted to the judging section 4a of the deciding circuit 4. Therefore, the judging section 4a receives the data d4 of the data signal D(n−1) and the data d3 of the data signal D(n) during the pulse period h3 (see FIG. 7). The judging section 4a judges whether the data d4 is equal to the data d3. Both data d4 and d3 are D1=(0,1), so that the data d4 is equal to the data d3. Therefore, the judging section 4a outputs the judging signal Sd of the logic '1' representing D(n−1) is equal to D(n) to the counter 4b during the pulse period h3.

The above elucidation is given to the circuit operations in the case in which the circuit device 1 is supplied with the pulses P1 to P3 of the clock signal CK, but the similar elucidation is given to the circuit operations in the case in which the circuit device 1 is supplied with the pulses P4 to P7 of the clock signal CK. Therefore, the counter 4b increments the count value nc in response to the pulse P4, so that nc becomes 3 (i.e. nc=3), and then the counter 4b increments the count value nc in response to the pulses P5, P6, and P7, so that nc becomes 4, 5, and 6 respectively. When the count value nc becomes 6 by this increment, this means that D(n−1) is equal to D(n) during the successive 6 pulse periods h1 to h6 (namely, in each of the data signals D(n+2) to D(n+7), the data during the pulse period h9 is equal to the data during pulse period h8).

Next, the case in which the circuit device 1 is supplied with the pulse P8 of the clock signal CK is discussed.

This pulse P8 is inputted to the D flip-flop F0 and the clock driver 5. Since the control signal Sk of the logic '0' is being inputted to the clock driver 5 at the time t8 of the rise edge of the pulse P8, the clock driver 5 supplies the D flip-flops F1 to F7 with the pulse P8 as the pulse P8 of the internal clock signal CKi. Therefore, the pulse P8 is supplied to not only the D flip-flop F0 but also the D flip-flops F1 to F7. In response to the pulse P8, the D flip-flop F0 introduces the data d8 of the data signal D(n−1) thereinto and then outputs the introduced data d8 to the next flip-flop F1. Similarly, in response to the rise edge of the pulse P8, each of the other D flip-flops F1 to F7 introduces the outputted data from the preceding D flop-flop and then outputs the introduced data.

The pulse P8 is also inputted to the counter 4b of the deciding circuit 4. Depending on whether the judging signal Sd being inputted to the counter 4b is the logic '0' or '1', the counter 4b resets or increments the count value nc in response to the rise edge of the pulse P8. Since the judging signal Sd is the logic '1' (i.e. d8=d7) at the time t8 of the rise edge of the pulse P8, the counter 4b increments the count value nc in response to the rise edge of the pulse P8, so that nc becomes 7 (i.e. nc=7). The count value nc=7 means that D(n−1) is equal to D(n) during the successive 7 pulse periods h1 to h7 (namely, in each of the data signals D(n+1) to D(n+7), the data during the pulse period h9 is equal to the data during pulse period h8). The counter 4b outputs the count signal Sc representing the count value nc=7 to the comparator 4c.

Since the count value nc is 7 (i.e. nc=7), nc is larger than nr (i.e. nc>nr). Therefore, the comparator 4c outputs the result signal So of the logic '1' meaning that the count value nc is larger than the comparison value nr=6 to the delay section 4d during the pulse period h8.

The delay section 4d delays the result signal So by a half pulse period and then outputs the half pulse period delayed result signal So to the clock driver 5 as the control signal Sk.

While the D flip-flop F0 outputs the data d8 to the next flip-flop F1 in response to the pulse P8, the D flip-flop F0 receives the next data d9 of the data signal D(n−1). The outputted data d8 from the D flip-flop F0 and the next data d9 inputted to the D flip-flop F0 are inputted to the judging section 4a of the deciding circuit 4. Therefore, during the pulse period h8 (see FIG. 7), the judging section 4a receives the data d9 of the data signal D(n−1) and the data d8 of the data signal D(n). The judging section 4a judges whether the data d9 is equal to the data d8. Both data d9 and d8 are D1=(0,1), so that the data d9 is equal to the data d8. Therefore, the judging section 4a outputs the judging signal Sd of the logic '1' representing D(n−1) is equal to D(n) to the counter 4b during the pulse period h8.

When the circuit device 1 is supplied with the pulse P8, the circuit device 1 operates as described above.

Next, the case in which the circuit device 1 is supplied with the pulse P9 of the clock signal CK is discussed.

This pulse P9 is inputted to the D flip-flop F0 and the clock driver 5. It is noted that the control signal Sk of the logic '1' is being inputted to the clock driver 5 at the time t9 of the rise edge of the pulse P9. Since the control signal Sk of the logic '1' means the blocking of the supply of the pulse, the clock driver 5 blocks the supply of the pulse P9 to the D flip-flops F1 to F7. Namely, the pulse P9 is supplied to the D flip-flop F0 but is not supplied to the D flip-flops F1 to F7. Therefore, the D flip-flop F0 introduces the data d9 of the data signal D(n−1) thereinto and then outputs the introduced data d9 to the next flip-flop F1 in response to the pulse P9, but the D flip-flops F1 to F7 continue to output, during the pulse period h9 as well, the data outputted during the pulse period h8. For example, the D flip-flop F1 outputting the data signal D(n+1) outputs, during the pulse period h9 as well the data d7 outputted during the pulse period h8. Furthermore, the D flip-flop F2 outputting the data signal D(n+2) outputs, during the pulse period h9 as well, the data d6 outputted during the pulse period h8. The other D flip-flops F3 to F7 can be considered similarly. For example, the end D flip-flop F7 outputting the data signal D(n+7) (=Out) outputs, during the pulse period h9 as well, the data d1 outputted during the pulse period h8. Namely, in each of the data signals D(n+1) to D(n+7) outputted from the D flip-flops F1 to F7, the same data as during the pulse period h8 is outputted during the pulse period h9 by blocking the supply of the pulse P9. Now, the data signals D(n+1) to D(n+7) shown in FIG. 7 are contrasted with the data signals D(n+1) to D(n+7) obtained by supplying with the pulse P9, respectively. The data signals D(n+1) to D(n+7) obtained by supplying with the pulse P9 are shown in FIG. 4. It can be understood that, contrasting FIG. 4 with FIG. 7, the data of each of the data signals D(n+1) to D(n+7) during the pulse period h9 is D1=(0,1) irrespective of whether the pulse P9 is supplied, so that the identity of data is kept. Therefore, it is understood that the supply of the pulse P9 can be blocked with the identity of data kept, so that the power consumption of the circuit device 1 can be reduced.

The pulse P9 is not supplied to the D flip-flops F1 to F7 as described above, but the pulse P9 is supplied to the counter 4b of the deciding circuit 4. The count value nc of the counter 4b has already reached 7 (i.e. nc=7) at the time when the pulse P9 is supplied. If nc has reached 7 (i.e. nc=7), the counter 4b resets or holds the count value nc=7 according to whether the judging signal Sd is the logic '0' or '1'. Since the judging signal Sd is the logic '1' (i.e. d9=d8) at the time t9 of the rise edge of the pulse P9, the counter 4b continues to hold the count value nc=7. The count value nc=7 during the pulse period h9 means that D(n−1) is equal to D(n) over successive 7 pulse periods h2 to h8 (namely, in each of the data signals D(n+1) to D(n+7), the data during the pulse period h10 is equal to the data during pulse period h9). The counter 4b outputs the count signal Sc representing the count value nc=7 to the comparator 4c.

Since the count value nc is 7 (i.e. nc=7), nc is larger than nr (i.e. nc>nr). Therefore, the comparator 4c outputs the result signal So of the logic '1' meaning that the count value nc is larger than the comparison value nr=6 to the delay section 4d during the pulse period h9.

The delay section 4d delays the result signal So by a half pulse period and then outputs the half pulse period delayed result signal So to the clock driver 5 as the control signal Sk.

While the D flip-flop F0 outputs the data d9 to the next flip-flop F1 in response to the pulse P9, the D flip-flop F0 receives the next data d10 of the data signal D(n−1). The outputted data d9 from the D flip-flop F0 and the next data d10 inputted to the D flip-flop F0 are inputted to the judging section 4a of the deciding circuit 4. Therefore, during the pulse period h9 (see FIG. 7), the judging section 4a receives the data d10 of the data signal D(n−1) and the data d9 of the data signal D(n). The judging section 4a judges whether the data d10 is equal to the data d9. Both data d10 and d9 are D1=(0,1), so that the data d10 is equal to the data d9. Therefore, the judging section 4a outputs, during the pulse period h9, the judging signal Sd of the logic '1' representing D(n−1) is equal to D(n) to the counter 4b.

When the circuit device 1 is supplied with the pulse P9, the circuit device 1 operates as described above.

Next, the case in which the circuit device 1 is supplied with the pulse P10 of the clock signal CK is discussed.

This pulse P10 is inputted to the D flip-flop F0 and the clock driver 5. It is noted that the control signal Sk of the logic '1' is being inputted to the clock driver 5 at the time t10 of the rise edge of the pulse P10. Since the control signal Sk of the logic '1' means the blocking of the supply of the pulse, the clock driver 5 blocks the supply of the pulse P10 to the D flip-flops F1 to F7. Namely, the pulse P10 is supplied to the D flip-flop F0 but is not supplied to the D flip-flops F1 to F7. Therefore, the D flip-flop F0 introduces the data d10 of the data signal D(n−1) thereinto and then outputs the introduced data d10 to the next flip-flop F1 in response to the pulse P10, but the D flip-flops F1 to F7 continue to output, during the pulse period h10 as well, the data outputted during the pulse period h9. For example, the D flip-flop F1 outputting the data signal D(n+1) outputs, during the pulse period h10 as well, the data d7 outputted during the pulse period h9. Furthermore, the D flip-flop F2 outputting the data signal D(n+2) outputs, during the pulse period h10 as well, the data d6 outputted during the pulse period h9. The other D flip-flops F3 to F7 can be considered similarly. For example, the end D flip-flop F7 outputting the data signal D(n+7) (=Out) outputs, during the pulse period h10 as well, the data d1 outputted during the pulse period h9. Namely, in each of the data signals D(n+1) to D(n+7) outputted from the D flip-flops F1 to F7, the same data as during the pulse period h9 is outputted during the pulse period h10 by blocking the supply of the pulse P10. When FIG. 7 is contrasted with FIG. 4 again, it can be understood that the data of each of the data signals D(n+1) to D(n+7) during the pulse period h10 is D1=(0,1) irrespective of whether the pulse P10 is supplied, so that the identity of data is kept. Therefore, it is understood that the supply of the pulse P10 can be blocked with the identity of data kept, so that the power consumption of the circuit device 1 can be reduced.

The pulse P10 is not supplied to the D flip-flops F1 to F7 as described above, but the pulse P10 is supplied to the counter 4b of the deciding circuit 4. The count value nc of the counter 4b has already reached 7 (i.e. nc=7) at the time when the pulse P10 is supplied. If nc has reached 7 (i.e. nc=7), the counter 4b resets or holds the count value nc=7 according to whether the judging signal Sd is the logic '0' or '1'. Since the judging signal Sd is the logic '1' (i.e. d10=d9) at the time t10 of the rise edge of the pulse P10, the counter 4b continues to hold the count value nc=7. The count value nc=7 during the pulse period h10 means that D(n−1) is equal to D(n) during the successive 7 pulse periods h3 to h9 (namely, in each of the data signals D(n+1) to D(n+7), the data during the pulse period h11 is equal to the data during pulse period h10). The counter 4b outputs the count signal Sc representing the count value nc=7 to the comparator 4c.

Since the count value nc is 7 (i.e. nc=7), nc is larger than nr (i.e. nc>nr). Therefore, the comparator 4c outputs the result signal So of the logic '1' meaning that the count value nc is larger than the comparison value nr=6 to the delay section 4d during the pulse period h10.

The delay section 4d delays the result signal So by a half pulse period and then outputs the half pulse period delayed result signal So to the clock driver 5 as the control signal Sk.

While the D flip-flop F0 outputs the data d10 to the next flip-flop F1 in response to the pulse P10, the D flip-flop F0 receives the next data d11 of the data signal D(n−1). The outputted data d10 from the D flip-flop F0 and the next data d11 inputted to the D flip-flop F0 are inputted to the judging section 4a of the deciding circuit 4. Therefore, during the pulse period h10 (see FIG. 7), the judging section 4a receives the data d11 of the data signal D(n−1) and the data d10 of the data signal D(n). The judging section 4a judges whether the data d11 is equal to the data d10. The data d11 is D2=(1,1) and the data d10 is D1=(0,1), so that the data d11 is different from the data d10. Therefore, the judging section 4a outputs the judging signal Sd of the logic '0' representing D(n−1) is not equal to D(n) to the counter 4b during the pulse period h10.

When the circuit device 1 is supplied with the pulse P10, the circuit device 1 operates as described above.

Next, the case in which the circuit device 1 is supplied with the pulse P11 of the clock signal CK is discussed.

This pulse P11 is inputted to the D flip-flop F0 and the clock driver 5. It is noted that the control signal Sk of the logic '1' is being inputted to the clock driver 5 at the time t11 of the rise edge of the pulse P11. Since the control signal Sk of the logic '1' means the blocking of the supply of the pulse, the clock driver 5 blocks the supply of the pulse P11 to the D flip-flops F1 to F7. Namely, the pulse P11 is supplied to the D flip-flop F0 but is not supplied to the D flip-flops F1 to F7. Therefore, the D flip-flop F0 introduces the data d11 of the data signal D(n−1) thereinto and then outputs the introduced data d11 to the next flip-flop F1 in response to the pulse P11, but the D flip-flops F1 to F7 continue to output, during the pulse period h11 as well, the data outputted during the pulse period h10. For example, the D flip-flop F1 outputting the data signal D(n+1) outputs, during the pulse period h11 as well, the data d7 outputted during the pulse period h10. Furthermore, the D flip-flop F2 outputting the data signal D(n+2) outputs, during the pulse period h11 as well, the data d6 outputted during the pulse period h10. The other D flip-flops F3 to F7 can be considered similarly. For example, the end D flip-flop F7 outputting the data signal D(n+7) (=Out) outputs, during the pulse period h11 as well, the data d1 outputted during the pulse period h10. Namely, in each of the data signals D(n+1) to D(n+7) outputted from the D flip-flops F1 to F7, the same data as during the pulse period h10 is outputted during the pulse period h11 by blocking the supply of the pulse P11. When FIG. 7 is contrasted with FIG. 4 again, it can be understood that the data of each of the data signals D(n+1) to D(n+7) during the pulse period t11 is D1=(0,1) irrespective of whether the pulse P11 is supplied, so that the identity of data is kept. Therefore, it is understood that the supply of the pulse P11 can be blocked with the identity of data kept, so that the power consumption of the circuit device 1 is reduced.

The pulse P11 is not supplied to the D flip-flops F1 to F7 as described above, but the pulse P11 is supplied to the counter 4b of the deciding circuit 4. The count value nc of the counter 4b has already reached 7 (i.e. nc=7) at the time when the pulse P11 is supplied. If nc has reached 7 (i.e. nc=7), the counter 4b resets or holds the count value nc=7 according to whether the judging signal Sd is the logic '0' or '1'. The judging signal Sd is the logic '0' at the time t11 of the rise edge of the pulse P11, this means that, in the data signal D(n+1), the data to be outputted during the next pulse period h12 is different from the data outputted during the pulse period h11. Therefore, assuming that the supply of the next pulse P12 to the D flip-flop F1 is blocked, the D flip-flop F1 outputs, during the next pulse period h12 as well, the data outputted during the pulse period h11, so that the data different from the original data is outputted during the pulse period h12. To avoid this problem, if the judging signal Sd is the logic '0', the counter 4b resets the count value. The counter 4b outputs the count signal Sc representing the count value nc=0 to the comparator 4c.

Since the count value nc is 0 (i.e. nc=0), nc is smaller than nr (i.e. nc<nr). Therefore, the comparator 4c outputs the result signal So of the logic '0' meaning that the count value nc is equal to or smaller than the comparison value nr(=6) to the delay section 4d during the pulse period h11.

The delay section 4d delays the result signal So by a half pulse period and then outputs the half pulse period delayed result signal So to the clock driver 5 as the control signal Sk.

While the D flip-flop F0 outputs the data d11 to the next flip-flop F1 in response to the pulse P11, the D flip-flop F0 receives the next data d12 of the data signal D(n−1). The outputted data d11 from the D flip-flop F0 and the next data d12 inputted to the D flip-flop F0 are inputted to the judging section 4a of the deciding circuit 4. Therefore, during the pulse period h11 (see FIG. 7), the judging section 4a receives the data d12 of the data signal D(n−1) and the data d11 of the data signal D(n). The judging section 4a judges whether the data d12 is equal to the data d11. The data d12 and d11 are D2=(1,1), so that the data d12 is equal to the data d11. Therefore, the judging section 4a outputs the judging signal Sd of the logic '1' means that D(n−1) is equal to D(n) to the counter 4b during the pulse period h11.

When the circuit device 1 is supplied with the pulse P11, the circuit device 1 operates as described above.

Next, the case in which the circuit device 1 is supplied with the pulse P12 of the clock signal CK is discussed.

This pulse P12 is inputted to the D flip-flop F0 and the clock driver 5. Since the control signal Sk of the logic '0' is being inputted to the clock driver 5 at the time t12 of the rise edge of the pulse P12, the clock driver 5 supplies the D flip-flops F1 to F7 with the pulse P12 as the pulse P12 of the internal clock signal CKi. Therefore, the pulse P12 is supplied to not only the D flip-flop F0 but also the D flip-flops F1 to F7. In response to the pulse P12, the D flip-flop F0 introduces the data d12 of the data signal D(n−1) thereinto and then outputs the introduced data d12 to the next flip-flop F1. Similarly, in response to the rise edge of the pulse P12, each of the other D flip-flops F1 to 17 introduces the outputted data from the preceding D flop-flop and then outputs the introduced data.

The pulse P12 is also inputted to the counter 4b of the deciding circuit 4. Depending on whether the judging signal Sd being inputted to the counter 4b is the logic '0' or '1', the counter 4b resets or increments the count value nc in response to the rise edge of the pulse P12. Since the judging signal Sd being inputted to the counter 4b is the logic '1' (i.e. d12=d11) at the time t12 of the rise edge of the pulse P12, the counter 4b increments the count value nc in response to the rise edge of the pulse P12, so that nc becomes 1 (i.e. nc=1). The count signal Sc representing the count value nc=1 is outputted to the comparator 4c.

Since the count value nc is 1 (i.e. nc=1), nc is smaller than nr (i.e. nc<nr). Therefore, the comparator 4c outputs the result signal So of the logic '0' meaning that the count value nc is equal to or smaller than the comparison value nr=6 to the delay section 4d during the pulse period h12.

The delay section 4d delays the result signal So by a half pulse period and then outputs the half pulse period delayed result signal So to the clock driver 5 as the control signal Sk.

Similarly, in the circuit device 1, the counter 4b increments or resets the count value nc according to whether two data inputted to the judging section 4a are equal, the operation for blocking the supply of the next pulse is carried out repeatedly each time the count value nc reaches 7.

According to the circuit device 1 constituted as described above, the supply of the pulse can be blocked with the identity of the data signal Out kept, so that the power consumption of the circuit device 1 is reduced.

The control circuit 3 controls whether the D flip-flops F1 to F7 should be supplied with the pulse P of the clock signal CK on the basis of the data signal D(n) outputted from the front D flip-flop F0 and the data signal D(n−1) inputted to the front D flip-flop F0. Therefore, the dedicated signal for only controlling whether the D flip-flops F1 to F7 should be supplied with the pulse P of the clock signal CK is not required, so that the circuit device 1 can be simplified.

In the control circuit 3, the delay section 4d is located at the succeeding side of the comparator 4c as shown in FIG. 6, but may be located between the counter 4b and the comparator 4c for example.

Figure 8:
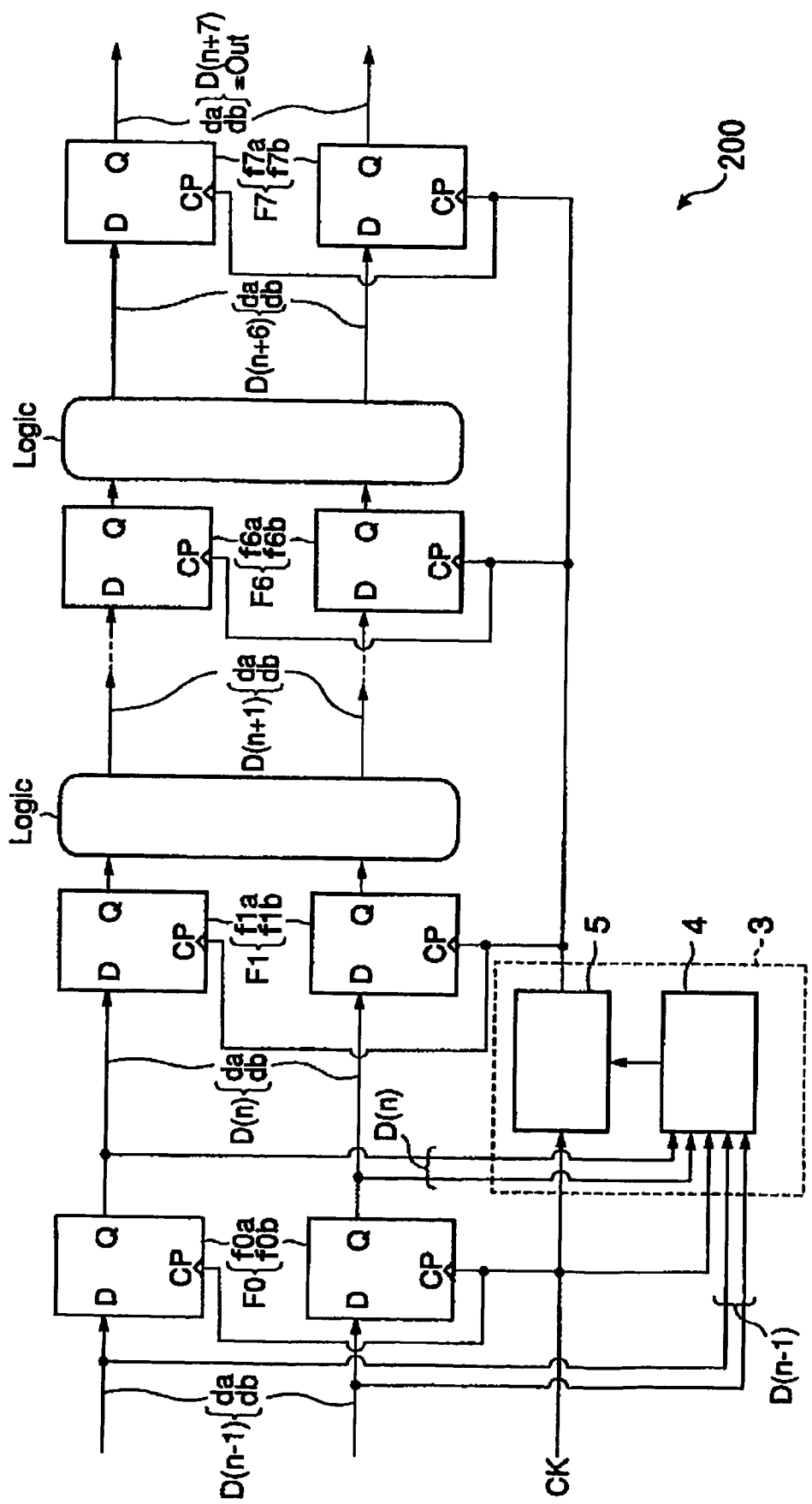
FIG. 8 is schematic diagram showing a circuit device 100 of the second embodiment according to the present invention.

FIG. 8 is schematic diagram showing a circuit device 200 of the second embodiment according to the present invention.

The description will be mainly given to the difference in the circuit device 200 of FIG. 8 from the circuit device 1 of FIG. 1.

The only difference between the circuit devices 200 of the FIG. 8 and the circuit device 1 of FIG. 1 is to provide the circuit device 200 of FIG. 8 with the logic circuit Logic between the preceding D flip-flop and the succeeding D flip-flop. The circuit device 200 is provided with the logic circuits Logic between the D flip-flops as described above, but the device 200 can control whether the supply of the pulse P to the D flip-flops F1 to F7 should be allowed or blocked according to whether the data signals D(n) and D(n−1) are equal just as in the case of the circuit device 1 of the first embodiment. Therefore, the supply of the pulse can be blocked with the identity of the data signal Out kept, so that the power consumption of the circuit device 1 is reduced.

Like the control circuit 3 of the circuit device 1 of FIG. 1, the control circuit 3 of the circuit device 200 requires no dedicated signal for only controlling whether the D flip-flops F1 to F7 should be supplied with the pulse P of the clock signal CK, so that the circuit device 200 can be simplified.

According to the present invention, the power consumption can be reduced without the dedicated signal.

The invention claimed is:

1. A circuit device comprising: a first delay circuit, a second delay circuit, and a third delay circuit, each for outputting data in response to a pulse of a clock signal, the first, second and third delay circuits being serially coupled; a signal processing circuit for processing said outputted data from said first delay circuit; and a control circuit for controlling whether said second delay circuit and said third delay circuit should be supplied with said pulse of said clock signal on the basis of whether outputted data from said first delay circuit in response to said pulse of said clock signal is equal to data to be outputted from said first delay circuit in response to the next pulse.

2. A circuit device as claimed in claim 1, wherein each of said delay circuits comprises a plurality of data inputting portions for receiving data and a plurality of data outputting portions for outputting data.

3. A circuit device as claimed in claim 1, wherein said control circuit comprises: a deciding circuit for deciding whether said second delay circuit should be supplied with said pulse of said clock signal an the basis of whether said outputted data from said first delay circuit in response to said pulse of said clock signal is equal to said data to be outputted from said first delay circuit in response to the next pulse; and a clock driver for allowing or blocking supply of said pulse of said clock signal to said second delay circuit in accordance with a decision of said deciding circuit.

4. A circuit device as claimed in claim 3, wherein said deciding circuit comprises: a judging section for judging whether said outputted data from said first delay circuit in response to each pulse of said clock signal is equal to said data to be outputted in said first delay circuit in response to the next pulse, a counter for incrementing a count value when said judging section judges both data to be equal and resetting a counter value when said judging section judges both data not to be equal; and a control signal generating section for comparing said count value with a comparison value to obtain a comparison result and for outputting, on the basis of said comparison result, a pulse supply controlling signal representing whether said second delay circuit should be supplied with said pulse of said clock signal.

5. A circuit device as claimed in claim 4, wherein said comparison value corresponds to a total number of said second delay circuits.

6. A circuit device as claimed in claim 1, wherein each of said first delay circuits and second delay circuits is constructed by one or more D flip-flops.

* * * * *